United States Patent [19]
Takita et al.

[11] Patent Number: 5,334,565
[45] Date of Patent: Aug. 2, 1994

[54] METHOD OF MANUFACTURING SILICON NITRIDE WHISKERS

[75] Inventors: Yusaku Takita, 1196-93 Suzan Miyazaki, Ohita-shi, Ohita-ken; Tatsumi Ishihara, Ohita; Yukako Mizuhara, Ohita; Masao Noguchi, Ohita, all of Japan

[73] Assignees: Nakama Syokai Company; Tokai Kogyo Company; Yusaku Takita; Ohita Gas Co., Ltd.; Ohgasu Co., Ltd., all of Beppu, Japan

[21] Appl. No.: 824,329

[22] Filed: Jan. 23, 1992

[30] Foreign Application Priority Data

Mar. 8, 1991 [JP] Japan ............................. 3-067579

[51] Int. Cl.⁵ .............................................. C04B 35/02
[52] U.S. Cl. ........................................ 501/95; 501/97; 264/65
[58] Field of Search .................. 501/95, 97; 264/65

[56] References Cited

U.S. PATENT DOCUMENTS 4,101,616 7/1978 Buljan .................................... 264/65
5,110,773 5/1992 Corral et al. ......................... 501/98

Primary Examiner—Karl Group
Assistant Examiner—Chris Gallo
Attorney, Agent, or Firm—Samuels, Gauthier & Stevens

[57] ABSTRACT

Disclosed is a method for producing long silicon nitride whiskers. The production method encompasses reacting diatomaceous earth on a carbon boat in a gas flow composed of a reducing agent and a nitriding agent at a temperature of 1,200°–1,700° C.

12 Claims, 2 Drawing Sheets

METHOD OF MANUFACTURING SILICON NITRIDE WHISKERS

BACKGROUND OF THE INVENTION

1. Field of the Invention

The present Invention relates to a method of producing fibriform silicon nitride, and more specifically, to a method of manufacturing silicon nitride whiskers having a long size.

2. Description of the Prior Art

A silicon carbide (SiC) material is known as a structural material, and when compared with this, a silicon nitride ($Si_3N_4$) material is excellent in corrosion resistance, abrasion resistance, heat resistance and mechanical strength and has been widely used as a dispersion reinforcement. Therefore, it is wise to use the silicon nitride material for reinforcement of a silicon carbide material in order to obtain an improved structural material able to endure to high temperature. On the other hand, in the field of structural materials, fiber reinforced ceramics has been known as promising structural materials, and it is therefore retarded that fiber reinforcements may be useful. In the above circumstances, there is a need for a fibriform silicon nitride material has arised.

With regard to silicon nitride powder, various manufacturing methods have been achieved, and typical one is disclosed by V. Vanedenede, A. Leriche, F. Cambier, H. Pickup, and R. J. Brook in "Sinterability of Silicon Nitride Powders and Characterization of Sintered Material", pp.53-67 in *Non-oxide Technical and Engineering Ceramics*, Edited by S. Hampshire. Elsevier, London, 1986. However, with respect to the formation of fibriform silicon nitride, only a few studies have been conducted, which are, for example, disclosed by U. Saito, Th Hayashi and K. Miura in "Effect of Fluorides on Vapor Phase Browth of Silicon Nitride Whiskers", Nippon Kagaku Kaishi, 401(1982); and by T. Hayashi, S. Kawabe and H. Saito in "Vapor Phase Growth of $\beta$-Sialon Whisker by Nitridation of the System $SiO_2$—C—$Na_3AlF_6$", Yogyu Kyokaishi, 94, 19(1986). At the present time, only production of silicon nitride whiskers having a length of only 200 $\mu m$ is known and such whiskers have already been supplied commercially. However. a method for producing long silicon nitride whiskers such as those having a length more than 10 mm has not yet been discovered.

SUMMARY OF THE INVENTION

It is therefore an object of the present Invention to provide a method of producing fibriform silicon nitride, using a raw silicon-containing material.

Another object of the preset invention is to provide a method of manufacturing long silicon nitride whiskers using diatomaceous earth.

In order to achieve the above-mentioned object, a method of manufacturing according to the present invention comprises: treating the raw silicon-containing material in an atmosphere including a reducing agent and a nitriding agent at a temperature within a range of approximately 1,200° C. to 1,700 ° C.

According to the above construction, fibriform silicon nitride having a length a length of approximately 1 mm or more can be produced effectively.

BRIEF DESCRIPTION OF THE DRAWINGS

The features and advantages of the contact material according to the present invention over the prior art materials will be more clearly understood from the following description of the preferred embodiments of the invention taken in conjunction with the accompanying drawings in which.

DETAILED DESCRIPTION OF THE PREFERRED EMBODIMENTS

Figure 1:
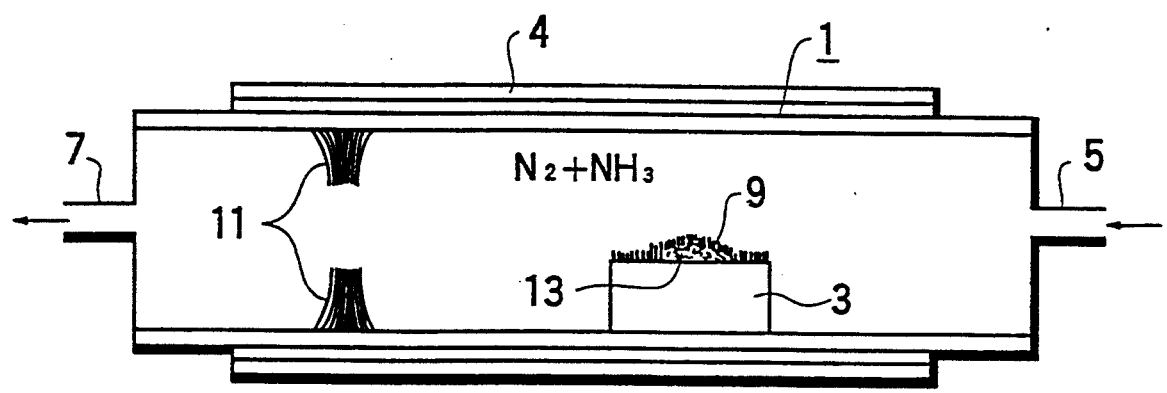
FIG. 1 is a schematlc diagram of an apparatus in which a raw silicon-containing material is reacted with a nitrogen source according to the method of the present invention.

In order to manufacture silicon nitride whiskers, the present inventors conducted research on the production of fibriform silicon nitride, while aiming at using diatomaceous earth, which is relatively cheap and available, as the raw material. As a result, the inventors found that long whiskers of silicon nitride can be obtained by the reduction and nitridation of diatomaceous earth in a spedific condition. A detailed explanation is described as follows.

Broadly, this invention contemplates a production method of long silicon nitride whiskers by reducing and nitriding the raw materials containing silicon with a reducing agent and a nitriding agent at a temperature within the range of 1,200° C. to 1,700° C.

In the reaction system of the present invention, a feed gas is utilized, and the reducing agent and nitrogen source are preferably supplied with the feed gas. Namely, the feed gas can preferably contain one or more of reducing agents. In the present invention, any reducing agents such as solid carbon; carbon oxide (CO); hydrocarbon such as methane or the like; or other reducing acent can be used in simple or combination. In this connection, only one agent such as solid carbon is sufficient for production of the silicon nitride whiskers according to the present invention. The concentration of reducing agent in the feed gas is within the range of 1 vol % to 99 vol %, and more preferably within the range of 10 vol % to 75 vol %.

The feed gas also contains one or more of nitriding agents. Any nitriding agents such as a nitrogen gas ($N_2$); ammonia gas ($NH_3$); hydrazine ($NH_2NH_2$): various organic amine compounds such as mono-, di- or triarkylamine or other nitrogen containing compound can be used ln the present invention. The concentration of nitriding agent in the feed gas is preferably within the range of approximately 10 vol % to 50 vol %. Ammonia, hydrazine and other compounds composed of nitrogen and hydrogen can act as both reducing agent and nitriding agent. Silicon nitride whiskers can be produced by using a feed gas containing one of these compounds even when the feed gas includes no diluent gas.

The raw materials used in this Invention can be selected out of the materials such as silicon dioxide, silicon monoxide, metallic silicon, and any other silicon-containing materials. Materials of natural origin can be used for the production of silicon nitride whisker according to the present invention.

The raw material preferably contains one or more elements belonging to the groups I to VIII in the periodic table, and more preferably, one of the group VIII transition metals such as iron, cobalt, nickel, ruthenium, rhodium, palladium, osmium, iridium and platinum; or chromium or manganese. In these elements, chromium and manganese are most preferable. When the raw materials contain no such elements, these elements may be mixed to the raw materials to be used. Alternatively, it is possible to introduce these elements into the reaction system by supplying the vapor of a compound including these elements, These elements are considered to act as a catalyst, which will be explained hereinafter, and only a small amount of these elements can effect sufficiently in the present invention. Moreover, even when the raw material contains few or no such elements, if a small amount of such a element exists as a impurity in the reaction system, this can work and achieves the production of silicon nitride whiskers. Consequently, the location of these elements is not limited to lie in the raw material.

In the present invention. a tubular type reaction system is preferred for producing the long silicon nitride whiskers. A typical apparatus for manufacturing the silicon nitride whiskers is shown In FIG. 1. In the drawing, numeral 1 indicates a tubular reactor which has an inner dimension of 36 mm and is located in a tubular electric furnace 4. A carbon boat 3 which is filled with a raw material powder is located inside the tubular reactor 1. Feed gas is supplied from a gas inlet 5, and passes through the reactor 1, being discharged from a gas outlet 7.

In operation, after the atmosphere inside the reactor 1 is completely-replaced with the feed gas, the temperature of the reactor 1 is Increased gradually to a desired level, and that temperature is maintained for a desired period. By the reaction, the powder 13 in the boat 3 changes into a mixture containing silicon nitride powder, silicon nitride fibers and SIALON (Si-Al-O-N solid solution compound, named PR). Moreover. as illustrated in FIG. 1, two kinds of silicon nitride whiskers are formed in the tubular reactor 1. One of the silicon nitride whiskers 9 are produced on the powder PR Inside the carbon boat, and has a relatively short length of approximately 1 mm (named inside whiskers, IW). On the other hand, another silicon nitride whiskers 11 are produced outside the a boat, specifically, grow on the wall of the tubular reactor downstream from the boat 3 (named outside whiskers, OW). This type of whiskers have a length of approximately 10 mm, which is rather long.

Figure 2:
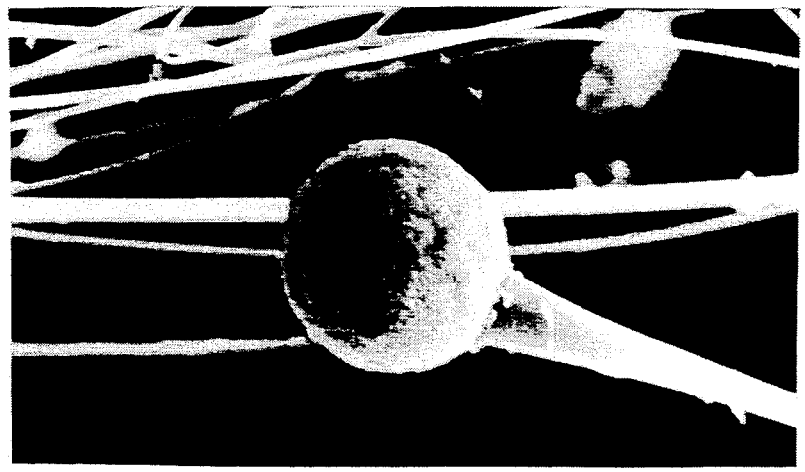
FIG. 2 is a scanning electron photomicrograph of a droplet at the tip of a silicon nitride whisker according to the present invention.

FIG. 2 is a photograph of OW by means of a scanning electron microscope (SEM). According to the observation of the photograph, it is clearly seen that a droplet having about 10 $\mu$m of diameter is attached to a tip of the OW. Analysis by means of energy dispersive X-ray spectrometer (EDX) shows that the droplets are composed of iron, and no silicon is detected in them. On the contrary, the fibers growing on the droplets contained no iron but silicon. In the light of the above-mentioned results, it should be considered that the metal component, such as iron. contained in the diatomaceous earth plays an important part such as a catalyst in the formation of silicon nitride whiskers, and that the silicon nitride is formed on the metal droplet in a liquid state, while it changes into a solid silicon nitride whisker, growing and extending from the droplet according to vapor-liquid-solid (VLS) mechanism.

Figure 3:
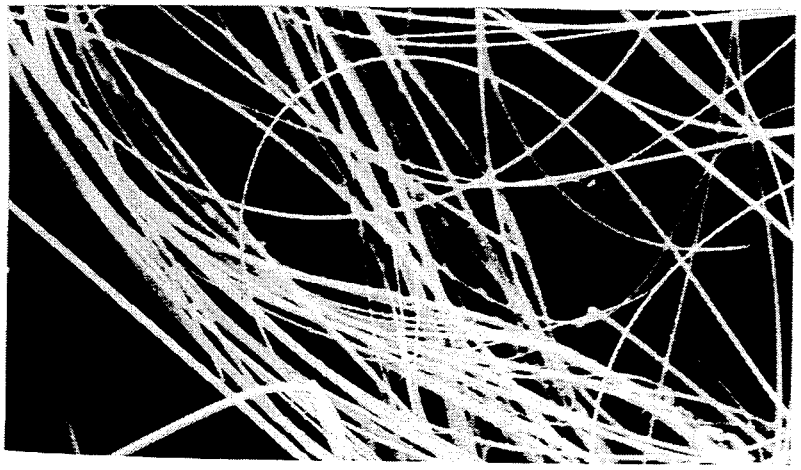
FIG. 3 is a scanning electron photomicrograph ($\times 2,000$) of silicon nitride whiskers (OW) according to the present invention.
Figure 4:
FIG. 4 is a scanning electron photomicrograph ($\times 10,000$) of the same silicon nitride whiskers shown in FIG. 3.

FIG. 3 shows a photograph of OW by means of the SEM, and FIG. 4 is an enlarged one of FIG. 3.

EXAMPLE 1

First, 0.5 g of a diatomaceous earth powder was poured into a carbon boat (15 mm width, 7 mm depth, 25 mm length). In this case, analytical data of the composition of the diatomaceous earth used here are described below. Then, the carbon boat was placed ln a gas flow (composition: 25 mol % $N_2$ and 75 mol % $NH_3$, flow rate: 40 $cm^3$/min) and heated at the temperature of 1350° C. for 24 hours. After the above treatment, 0.3275 g of PR, 0.0147 g of IW, and 0.0136 g of OW were obtained. Dimension of the obtained IW and OW were 1–10 $\mu$m 10 mm in length, and 0.1–2.0 $\mu$m i.d. and more than 10 mm in length, respectively. The obtained IW and OW were determined to be mixtures of $\alpha$-$Si_3N_4$ and $\beta$-$Si_3N_4$. By means of the X-ray diffraction method (XRD). Both of the IW and OW contained more than 80% of $\alpha$-$Si_3N_4$. By means of the high disolution TEM, both of the IW and OW were determined to be single crystal.

TABLE

| Composition of diatomaceous earth | |
|---|---|
| Component | Composition(wt %) |
| $SiO_2$ | 89.2 |
| $Al_2O_3$ | 5.7 |
| $Fe_2O_3$ | 1.8 |
| CaO | 0.9 |
| $Na_2O$ | 0.5 |
| $TiO_2$ | 0.2 |
| $K_2O$ | 0.2 |
| MgO | 0.2 |
| MnO | trace | ignition loss: 0.28%

According to the observation by SEM, a droplet having about 10 $\mu$m of diameter was attached to several OW as shown in FIG. 2. The droplets were composed of iron, and no silicon was detected in them, On the contrary, the fibers growing from the droplets contained no Iron but silicon.

EXAMPLE 2

When 0.20 g of pure amorphous $SiO_2$ powder (purity: 99.999%) was placed on a carbon boat and reacted under the same reaction conditions as in Example 1, 0.0016 g of OW was formed but no IW was obtained. The remaining in the boat had been changed into a cristobalite type structure. The length of OW was within a range of 10 to 20 mm.

In this case, it is considered that some metallic impurity existed inside the reactor and acted as a catalytic element.

EXAMPLE 3

First, 98 wt % of a $SiO_2$ power having a purity of 99.999% was mixed with 2 wt % of a $Fe_2O_3$ powder. Then, 0.20 g of the mixture obtained above was placed on a carbon boat and reacted under the same reaction conditions as in Example 1. After the reaction, 0.0055 g of IW, 0.0056 g of OW and 0.1365 g of PR had been formed. XRD patterns of IW and OW demonstrated the diffraction peaks due to $\alpha$- and $Si_3N_4$. The lengths of IW and OW were, respectively, within a range of 1 to 5 mm and a range of 10 to 20 mm.

EXAMPLE 4

First, 0.20 g of the mixture of 98 wt % $SiO_2$ (purity: 99.999 wt %) and 2 wt % $Cr_2O_3$ was placed on a carbon boat, and reacted under the same conditions as in Example 1. As a result, a trace amount of IW, 0.0069 g of OW and 0.1076 g of PR had been formed. XRD pattern of OW demonstrated the diffraction peaks due to $\alpha$- and $\beta$-$Si_3N_4$. PR contained mainly $\alpha$- and $\beta$-$Si_3N_4$. The lengths of IW and OW were 1–5 mm and 10–20 mm, respectively.

EXAMPLE 5

Under the same conditions as in Example 1, 0.20 g of the mixture of the same diatomaceous earth in Example 1 and 2 wt % MnO were reacted on a carbon boat. As a result, 0.0378 g of IW, 0.0093 g of OW and 0.2537 g of PR were obtained. XRD patterns of IW and OW demonstrated the diffraction peaks due to $\alpha$- and $\beta$-$Si_3N_4$. The lengths of IW and OW were 1–5 mm and 10–20 mm, respectively.

EXAMPLE 6

Under the same conditions as In Example, 1.4374 g of Beppu clay (composition: $SiO_2$ 94.1 wt %. $Al_2O_3$ 3.4 wt %, $TiO_2$ 1.3 wt %, $Fe_{23}$ 0.71 wt %, and CaO 0.19 wt %) was reacted on a carbon boat. As a result, 0.1935 g of IW, 0.0050 g of OW and 0.5378 g of PR were obtained. The PR mainly contained $\alpha$- and $\beta$-$SiO_3N_4$, and the IW and OW were almost completely composed of $\alpha$- and $\beta Si_3N_4$, respectively.

EXAMPLE 7

Under the same conditions as In Example 1 except that the reaction temperature was 1,300° C. 0.50 g of the same diatomaceous earth as used in Example 1 was reacted on a carbon boat. As a result, 0.0302 g of IW, 0.0027 g of OW and 0.2415 g of PR were obtained. XRD patterns of IW and OW demonstrated the diffraction peaks due to $\alpha$- and $\beta$- $Si_3N_4$. The PR contained mainly $\alpha$- and $\beta$-$Si_3N_4$. The lengths of IW and ow were 1–5 mm and 10–20 mm, respectively.

EXAMPLE 8

Under th3 same conditions as in Example 1 except that the reaction temperature was 1,450° C., 0.50 g of the same diatomaceous earth as used in Example 1 was reacted on a carbon boat. As a result, 0.0410 g of IW, 0.0045 g of OW and 0.2127 g of PR were obtained. XRD patterns of IW and OW demonstrated the diffraction peaks due to $\alpha$- and $\beta$-$Si_3N_4$. The PR, contained mainly $\alpha$- and $\beta$-$Si_3N_4$. The lengths of IW and OW were 1–5 mm and 10–20 mm, respectively.

EXAMPLE 9

Under the same conditions as in Example 1 except that the reaction temperature was 1.370° C., 0.20 g of metal Si was reacted on a carbon boat. As a result. 0.0009 g of IW, 0.0012 g of OW and 0.3226 g of PR were obtained. XRD patterns of IW and OW demonstrated the diffraction peaks due to $\alpha$- and $\beta$-$Si_3N_4$. The PR contained mainly $\alpha$- and $\beta$-$Si_3N_4$. The lengths of IW and OW were 1–5 mm and 10–20 mm, respectively.

It must be understood that the Invention is in no way limited to the above embodiments and that many changes may be brought about therein without departing from the scope of the Invention as defined by the appended claims.

What is claimed is:

1. A method of producing fibriform silicon nitride from a raw silicon-contalnlng material, comprising:
    treating the raw silicon-containing material and a catalytic element in an atmosphere including a reducing agent and a nitrfhing agent at a temperature within a range of approximately 1.200° C. to 1,700° C.

2. The method according to claim 1. wherein the raw material includes one selected from the group consisting silicon dioxide, silicon monoxide and silicon.

3. The method according to claim 1, wherein the reducing agent includes one selected from the group consisting of hydrogen, carbon oxide, ammonia, hydrazine and methane.

4. The method according to claim 1, wherein the reducing agent includes solid carbon.

5. The method according to claim 4, wherein the reducing agent further includes water vapor.

6. The method according to claim 1, wherein the nitriding agent includes a nitrogen-containing compound selected from the group consisting of a nitrogen gas, ammonia, hydrazine, organic amities, 7. The method according to claim 1, wherein the atmosphere is a gas flowing through the raw silicon-containing material.

8. The method according to claim 1, wherein the silicon nitride produced has a length not less than approximately 1 mm.

9. The method according to claim 1, wherein the catalytic element is selected from the group consisting of iron, cobalt, nickel, ruthenium, rhodium, palladium, osmium, iridium, platinum, chromium and manganese.

10. The silicon nitride product obtained by the method according to claim 1.

11. The method according to claim 1, wherein the catalytic element is a metallic element which is present in the raw silicon-containing material.

12. The method according to claim 1 wherein the raw silicon-containing material is treated in a reactor and the catalytic element is present as an impurity in said reactor.

* * * * *